(12) United States Patent
Yang

(10) Patent No.: US 12,205,956 B2
(45) Date of Patent: Jan. 21, 2025

(54) DISPLAY PANEL AND ELECTRONIC DEVICE

(71) Applicant: Wuhan China Star Optoelectronics Semiconductor Display Technology Co., Ltd., Hubei (CN)

(72) Inventor: Guoqiang Yang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/623,275

(22) PCT Filed: Dec. 21, 2021

(86) PCT No.: PCT/CN2021/139869
§ 371 (c)(1),
(2) Date: Dec. 28, 2021

(87) PCT Pub. No.: WO2023/108703
PCT Pub. Date: Jun. 22, 2023

(65) Prior Publication Data
US 2024/0038766 A1   Feb. 1, 2024

(30) Foreign Application Priority Data

Dec. 13, 2021   (CN) .......................... 202111515667.1

(51) Int. Cl.
*H01L 27/12*     (2006.01)
*G02F 1/1333*    (2006.01)
*G09F 9/30*      (2006.01)

(52) U.S. Cl.
CPC .... *H01L 27/1218* (2013.01); *G02F 1/133305* (2013.01); *G09F 9/301* (2013.01); *H01L 27/1262* (2013.01)

(58) Field of Classification Search
None
See application file for complete search history.

(56) References Cited

U.S. PATENT DOCUMENTS

2012/0001185 A1   1/2012 Lee et al.

FOREIGN PATENT DOCUMENTS

| CN | 109686867 | 4/2019 |
| CN | 110379823 | 10/2019 |

(Continued)

OTHER PUBLICATIONS

International Search Report and the Written Opinion Dated Aug. 25, 2022 From the International Searching Authority Re. Application No. PCT/CN2021/139869 and their Translations into English. (17 Pages).

(Continued)

*Primary Examiner* — Richard H Kim

(57) ABSTRACT

An electronic device and a display panel are provided. The display panel has a display region and a bending region positioned at one side of the display region. The display panel includes a first transparent substrate, a first inorganic layer, a second inorganic layer, and a blocking layer positioned at one side of the first transparent substrate. The second inorganic layer has a first via in the bending region of the display panel. This alleviates the mura near the bending region due to the exposure of the first transparent substrate and thus alleviates the mura issue occurred on the conventional display panel close to the bending region.

20 Claims, 5 Drawing Sheets

(56) References Cited

FOREIGN PATENT DOCUMENTS

| | | |
|---|---|---|
| CN | 110911424 | 3/2020 |
| CN | 111754872 | 10/2020 |
| CN | 113078195 | 7/2021 |
| CN | 113224120 | 8/2021 |
| CN | 113270560 | 8/2021 |
| CN | 113690251 | 11/2021 |
| CN | 113745247 | 12/2021 |

OTHER PUBLICATIONS

Notification of Office Action and Search Report Dated Jan. 18, 2023 From the State Intellectual Property Office of the People's Republic of China Re. Application No. 202111515667.1 and Its Translation of Office Action Into English. (5 Pages).

DISPLAY PANEL AND ELECTRONIC DEVICE

RELATED APPLICATIONS

This application is a National Phase of PCT Patent Application No. PCT/CN2021/139869 having International filing date of Dec. 21, 2021, which claims the benefit of priority of Chinese Patent Application No. 202111515667.1 filed on Dec. 13, 2021. The contents of the above applications are all incorporated by reference as if fully set forth herein in their entirety.

FIELD AND BACKGROUND OF THE INVENTION

The present disclosure relates to a display technology, and more particularly, to a display panel and an electronic device.

As the development progress of the display technology, the demands for display panels having a high screen-to-body ratio become higher. The display panel is being developed to be thinner and a full screen configuration. Furthermore, the full screen needs the under screen camera (USC) technique. As its name implies, the USC technique puts the front camera under the display panel. It's not difficult to put the front camera under the display panel. In fact, the difficulty of the USC technique is to make the under screen camera region transparent. In order to improve the transparency of the under screen camera region, the substrate of the display panel could be manufactured with the clear polyimide (CPI). However, the CPI has some issues, such as high thermal stress, high water absorption and high coefficient of thermal expansion. In this way, the display region of the display panel may have mura near the bending region.

Therefore, the mura issue, occurred on the display panel close to the bending region, needs to be solved.

SUMMARY OF THE INVENTION

One objective of an embodiment of the present disclosure is to provide a display panel and an electronic device, to alleviate the mura issue occurred on the display panel close to the bending region.

According to an embodiment of the present disclosure, a display panel having a display region and a bending region positioned at one side of the display region is disclosed. The display panel comprises a first transparent substrate, a first inorganic layer, a second inorganic layer, a semiconductor layer, and a blocking layer. The blocking layer that is positioned at one side of the first transparent substrate comprises a first blocking part located in the bending region. The first inorganic layer covers the first transparent substrate and the blocking layer. The semiconductor layer is positioned at one side of the first inorganic layer facing away the first transparent substrate. The second inorganic layer covers the semiconductor layer and the first inorganic layer. The second inorganic layer has a first via in the bending region. The first via passes through the second inorganic layer and the first inorganic layer. An orthographic projection of a bottom of the first via on the first transparent substrate falls within an orthographic projection of the first blocking part on the first transparent substrate.

Optionally, the blocking layer further comprises a plurality of blocking parts periodically positioned in the display region, and the second blocking parts at least partially overlap with the semiconductor layer.

Optionally, the display panel further comprises: a shielding layer, positioned between the blocking layer and the first inorganic layer, the shielding layer comprising: a first shielding part, positioned correspondingly to the first blocking part; and a second shielding part, positioned correspondingly to the second blocking part.

Optionally, a bottom surface of the first via extends to the shielding layer and exposes the first shielding part.

Optionally, the second shielding part at least partially overlaps with the semiconductor layer.

Optionally, the first shielding part overlaps with the first blocking part and the second shielding part overlaps with the second blocking part.

Optionally, a first groove is positioned at one side of the first shielding part facing away the first blocking part.

Optionally, the second inorganic layer comprises orderly stacked a gate insulating layer and an inter-layer insulating layer; the gate insulating layer covers the semiconductor layer and the first inorganic layer; and the display panel further comprises: a gate layer, positioned above the gate insulating layer, wherein the inter-layer insulating layer covers the gate layer and the gate insulating layer and is patterned to form the first via and to form a second via in the display region, and the second via exposes a part of the second shielding part; and a first source/drain layer, positioned above the inter-layer insulating layer, configured to form a power line in the display region, wherein the power line is connected to the second shielding part through the second via.

Optionally, the display panel further comprises a functional region close to the display region and a first thin film transistor (TFT) and a second TFT positioned in the display region, the first TFT is close to the functional region, and the display panel further comprises: a conductive electrode layer, positioned at one side of the first TFT and the second TFT facing away the first transparent substrate, configured to form a first pixel electrode in the functional region and to form a second pixel electrode in the display region, wherein the first pixel electrode is connected to the first TFT and the second pixel electrode is connected to the second TFT. The semiconductor layer forms a channel region and a source region and a drain region at two sides of the channel region of the first TFT and the second TFT in the display region. The gate layer forms a gate of the first TFT and the second TFT in the display region and forms a first signal transmission line in the bending region. The gate corresponds to the channel region; the first source/drain layer forms a first source and a first drain of the first TFT and the second TFT in the display region and forms a second signal transmission line in the bending region. The first source is connected to the source region. The first drain is connected to the drain region. The first signal transmission line is connected to the second transmission line.

Optionally, the display panel further comprises: a bridging layer, positioned between the first TFT and the conductive electrode layer, configured to form a first bridging electrode in the functional region and to form a second bridging electrode in the display region. The first pixel electrode is connected to the first TFT through the first bridging electrode and the second pixel electrode is connected to the second TFT through the second bridging electrode.

Optionally, the display panel further comprises: a first planarization layer, covering the first source/drain layer and the inter-layer insulating layer and filled up in the first via; a second source/drain layer, positioned above the first planarization layer, configured to form a second source of the first TFT and the second TFT in the display region and to form a plurality of bonding wires in the bending region; a second planarization layer, covering the second source/drain layer and the first planarization layer, wherein the bridging layer is positioned above the second planarization layer; and a third planarization layer, covering the bridging layer and the second planarization layer, wherein the conductive electrode layer is positioned above the third planarization layer. The first bridging electrode and the second bridging electrode are respectively connected to the corresponding second source; and the bonding wires are connected to the second signal transmission line.

Optionally, a second groove is positioned at one side of the first blocking part facing away the first transparent substrate.

According to another embodiment of the present disclosure, an electronic device comprising a functional component and a display panel is disclosed. The display panel has a display region and a bending region positioned at one side of the display region is disclosed. The display panel comprises a first transparent substrate, a first inorganic layer, a second inorganic layer, a semiconductor layer, and a blocking layer. The blocking layer that is positioned at one side of the first transparent substrate comprises a first blocking part located in the bending region. The first inorganic layer covers the first transparent substrate and the blocking layer. The semiconductor layer is positioned at one side of the first inorganic layer facing away the first transparent substrate. The second inorganic layer covers the semiconductor layer and the first inorganic layer. The second inorganic layer has a first via in the bending region. The first via passes through the second inorganic layer and the first inorganic layer. An orthographic projection of a bottom of the first via on the first transparent substrate falls within an orthographic projection of the first blocking part on the first transparent substrate.

Optionally, the blocking layer further comprises a plurality of blocking parts periodically positioned in the display region, and the second blocking parts at least partially overlap with the semiconductor layer.

Optionally, the display panel further comprises: a shielding layer, positioned between the blocking layer and the first inorganic layer, the shielding layer comprising: a first shielding part, positioned correspondingly to the first blocking part; and a second shielding part, positioned correspondingly to the second blocking part.

Optionally, a bottom surface of the first via extends to the shielding layer and exposes the first shielding part.

Optionally, the second shielding part at least partially overlaps with the semiconductor layer.

Optionally, the first shielding part overlaps with the first blocking part and the second shielding part overlaps with the second blocking part.

Optionally, a first groove is positioned at one side of the first shielding part facing away the first blocking part.

Optionally, the second inorganic layer comprises orderly stacked a gate insulating layer and an inter-layer insulating layer; the gate insulating layer covers the semiconductor layer and the first inorganic layer; and the display panel further comprises: a gate layer, positioned above the gate insulating layer, wherein the inter-layer insulating layer covers the gate layer and the gate insulating layer and is patterned to form the first via and to form a second via in the display region, and the second via exposes a part of the second shielding part; and a first source/drain layer, positioned above the inter-layer insulating layer, configured to form a power line in the display region, wherein the power line is connected to the second shielding part through the second via.

According to an embodiment of the present disclosure, an electronic device is disclosed. The electronic device comprises a functional device and a display panel. The display panel comprises a display region, a bending region positioned at one side of the display region, and a functional region close to the display region. The functional device is positioned correspondingly to the functional region. The display panel could comprise the above-mentioned display panel.

According to an embodiment of the present disclosure, a display panel and an electronic device are provided. The display panel comprises a blocking layer, a first inorganic layer, a semiconductor layer, a second inorganic layer orderly positioned above a first transparent substrate. The second inorganic layer has a first via in the bending region of the display panel. The first via passes through the first inorganic layer and the second inorganic layer. The orthographic projection of the bottom of the first via on the first transparent substrate falls within the orthographic projection of the first blocking part on the first transparent substrate. In this way, the first via exposes the blocking part. The blocking part could protect the first transparent substrate from moisture and the etching process for forming the first via. This alleviates the mura near the bending region due to the exposure of the first transparent substrate and thus alleviates the mura issue occurred on the conventional display panel close to the bending region.

BRIEF DESCRIPTION OF THE SEVERAL VIEWS OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

DESCRIPTION OF SPECIFIC EMBODIMENTS OF THE INVENTION

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Figure 1:
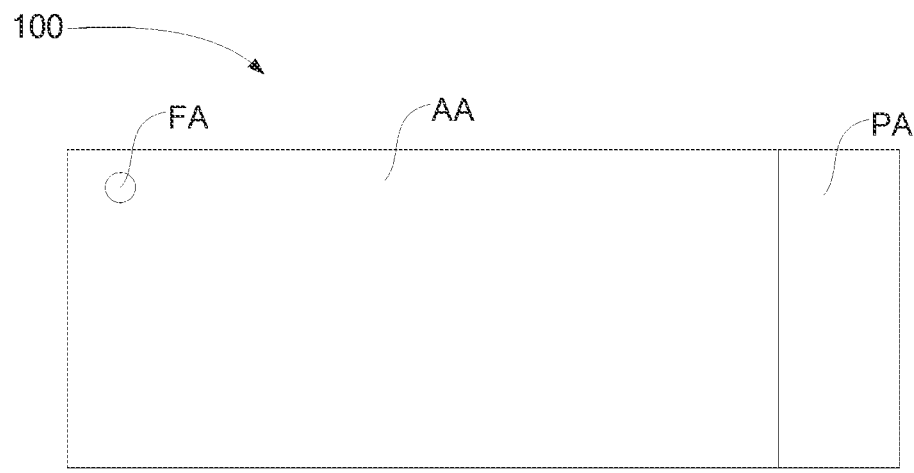
FIG. 1 is a top view of a display panel according to an embodiment of the present disclosure.
Figure 2:
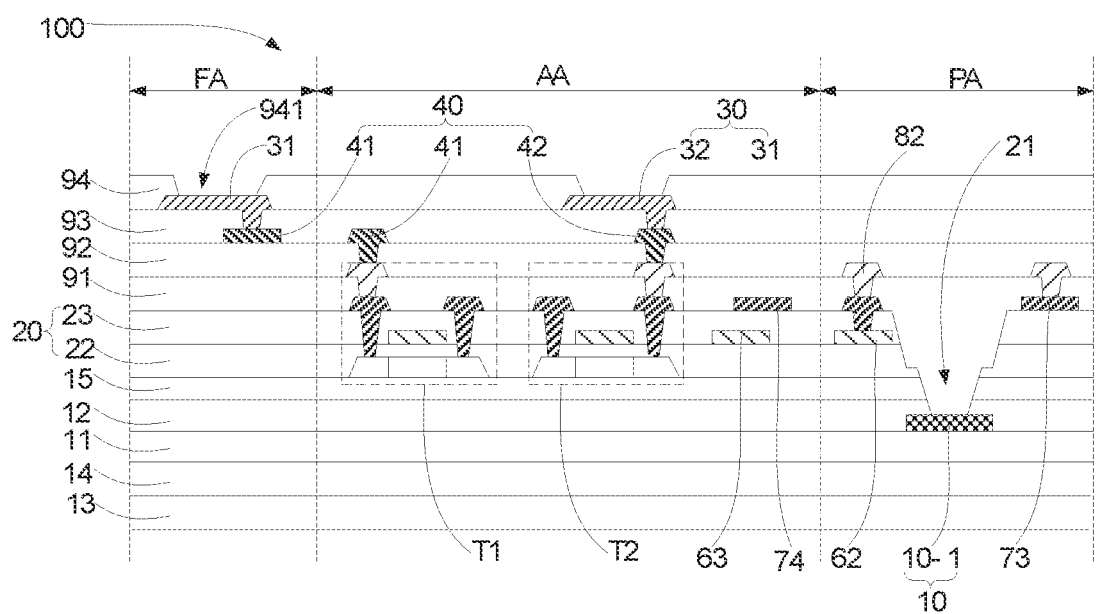
FIG. 2 is a diagram of a cross section of a display panel according to a first embodiment of the present disclosure.
Figure 3:
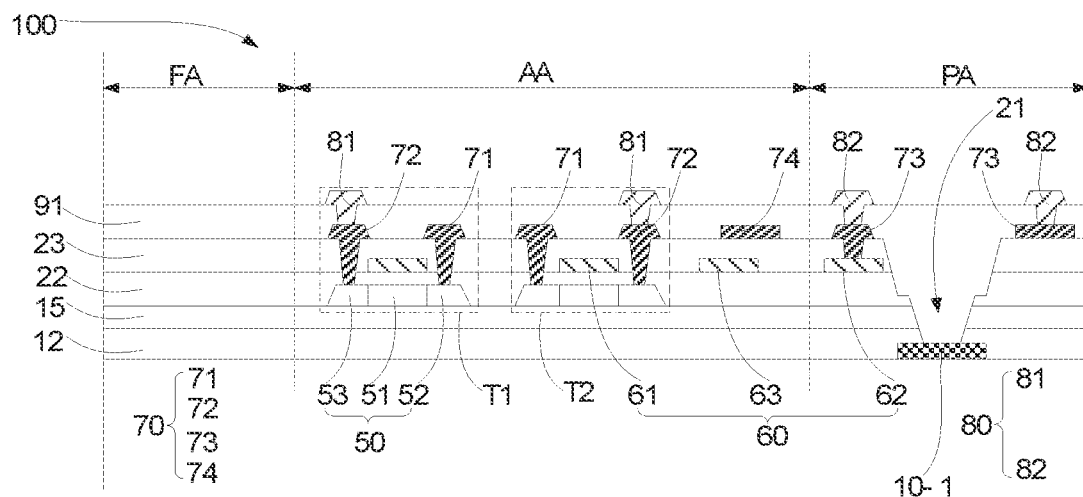
FIG. 3 is a diagram of a partial cross section of the display panel shown in FIG. 2.
Figure 4:
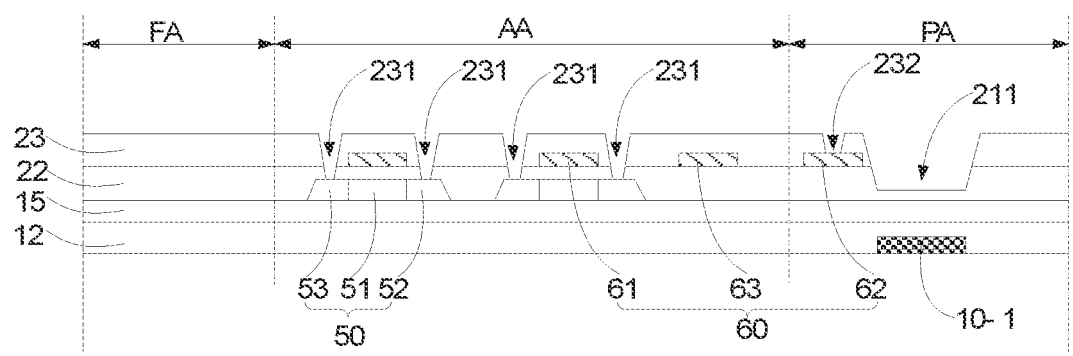
FIG. 4 and FIG. 5 depict details of a first via according to an embodiment of the present disclosure.
Figure 5:
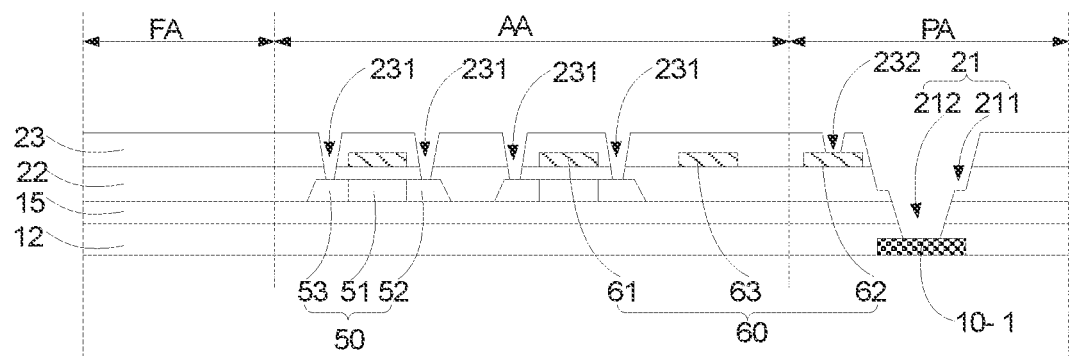

Please refer to FIGS. 1-5. FIG. 1 is a top view of a display panel according to an embodiment of the present disclosure. FIG. 2 is a diagram of a cross section of a display panel according to a first embodiment of the present disclosure. FIG. 3 is a diagram of a partial cross section of the display panel shown in FIG. 2. FIG. 4 and FIG. 5 depict details of a first via according to an embodiment of the present disclosure. The display panel 100 comprises a display region AA, a functional region FA adjacent to the display region AA, and a bending region PA positioned at a side of the display region AA. The bending region PA could be bended to the back of the display panel 100 to realize a narrow side frame or no side frame configuration. The functional region FA could be placed in any place of the display region AA. The functional region FA could be used to realize the under screen fingerprint identification, face identification, USC, or another function and could be used to realize the display function to realize the "real" full screen.

The display panel 100 further comprises a first transparent substrate 11, a blocking layer 10, a first inorganic layer 12, a semiconductor 50 and a second inorganic layer 20. The blocking layer 10 is positioned at one side of the first transparent substrate 11 and comprises at least the first blocking part 10-1 in the bending region PA. The first inorganic layer 12 covers the first transparent substrate 11 and the blocking layer 10. The semiconductor layer 50 is positioned at one side of the first inorganic layer 12 facing away the first transparent substrate 11. The second inorganic layer 20 covers the semiconductor layer 50 and the first inorganic layer 12. The second inorganic layer 20 has a first via 21 in the bending region PA. The first via 21 passes through the second inorganic layer 20 and the first inorganic layer 12 and the orthographic projection of the bottom of the first via 21 on the first transparent substrate 11 falls within the orthographic projection of the first blocking part 10-1 on the first transparent substrate 11. In this way, the first blocking part 10-1 blocks the place of the first transparent substrate 11 corresponding to the first via 21 to prevent the first via 21 from exposing the first transparent substrate 11.

The material of the first transparent substrate 11 comprises clear polyimide (CPI). Compared with yellow polyimide (YPI), the CPI has a better transparency. Therefore, using the CPI could increase the transparency of the functional region FA. However, the CPI also introduces some issues. For example, it is easier for moisture to pass through the CPI such that the moisture may enter the first transparent substrate 11 when the first via 21 is being formed. In addition, the thermal stress of the CPI is greater. This may cause the stress of the bending region PA to expand to the display region AA.

When the CPI is used to manufacture the first transparent substrate 11, a sacrificial layer (for example, SiOx/a-Si) is first formed on the glass substrate. Then, the CPI layer is coated on the sacrificial layer to form the transparent substrate. However, in the deep hole (DH) process, the etching gas CF4/O2 will oxidize the interface of the sacrificial layer and the CPI in the DH region under the effect of the electric field. This results in a huge difference between the interface in the DH region and the interface outside the DH region. Accordingly, when the sacrificial layer is removed, the difference at the interface results in the laser energy threshold difference for removing the sacrificial layer. This laser energy threshold difference results in the difference of shrinking degree of the transparent substrate corresponding to the TFT and thus influences the stress of the semiconductor layer and results in the difference of the semiconductor crystalline defects. Therefore, the characteristic of the TFT near the DH region may be deteriorated such that the display region near the DH region has mura. Here, the DH process means the deep hole process. For example, the first via 21 is formed by the DH process.

In this embodiment, the blocking layer 10 is positioned above the transparent substrate 11 and form a first blocking part 10-1 in the bending region PA. The first blocking part could block the first via 21. In this way, when the first via 21 is formed in the bending region PA, the first via 21 passes through the second inorganic layer 20 and the first inorganic layer 12. However, because of the first blocking part 10-1, the first via 21 does not expose the first transparent substrate 11 such that the mura does not occur due to the use of the CPI as the first transparent substrate 11. Optionally, the material of the blocking layer 10 comprises one of inorganic materials, such as SiOx and/or SiNx, or some other organic material that could efficiently block the moisture. In addition, because inorganic materials have better moisture blocking performance, the blocking layer 10 is preferably manufactured with an inorganic material.

In the following disclosure, the film layer structure above the display panel 100 will be illustrated:

The display panel 100 comprises a first transparent substrate 11, a blocking layer 10 positioned at one side of the first transparent substrate 11, a first inorganic layer 12 covering the blocking layer 10 and the first transparent substrate 11, a semiconductor layer 50 positioned above the first inorganic layer 12, and a second inorganic layer 20 covering the semiconductor layer 50 and the first inorganic layer 12.

Optionally, the display panel 100 comprises a third inorganic layer 14 and a second transparent substrate 12. The third inorganic layer 14 is positioned at one side of the first inorganic layer 12 facing away the first transparent substrate 11. The second transparent substrate 13 is positioned at one side of the third inorganic layer 14 facing away the first transparent substrate 11. The material of the second transparent substrate 13 is the same as the material of the first transparent substrate 11. The material of the third inorganic layer 14 is the same as the material of the first inorganic layer 12 to achieve a better moisture blocking function.

Optionally, the first transparent substrate 11 and the second transparent substrate 13 could be coated to perform wet thin film coating process. After the wet thin film coating process, a high vacuum dry (HVCD) process is performed to remove the solvent. Then, a curing process is performed to form a film. The HVCD process could be performed under a temperature of 40-80° C. and a pressure of 0-10 Pa for 250-550 seconds. The curing process could be performed under a temperature of 400-450° C. for minutes.

Specifically, an inorganic film structure, such as a SiOx film, a SiNx film, a stacked SiNx/SiOx/SiNx film structure, or a stacked SiOx/SiNx/SiOx/SiNx film structure, is formed on the first transparent substrate 11 and an etching process is performed on the formed inorganic film structure to form the first blocking part 10-1 in the bending region PA. Here, the thickness of the blocking layer 10 is 500 A-6000 A. When the blocking layer 10 is the stacked SiNx/SiOx/SiNx film structure, the thickness of the first SiNx layer is 50-2000 A, the thickness of the SiOx layer is 50-2000 A and the thickness of the second SiNx layer is 50-2000 A. When the blocking layer 10 is the stacked SiOx/SiNx/SiOx/SiNx film structure, the thickness of the first SiOx layer is 50-500 A, the thickness of the first SiNx layer is 500-2000 A, the second of the second SiOx layer is 500-2000 A, and the thickness of the second SiNx layer is 500-2000 A.

Furthermore, the first inorganic layer 12 covers the blocking layer 10 and the first transparent substrate 11. The material of the first inorganic layer 12 comprises inorganic materials, such as SiOx, SiNx, and/or SiON. The semiconductor layer 50 is formed above the first inorganic layer 12 and positioned correspondingly to the display region AA. The second inorganic layer 20 covers the semiconductor layer 50 and the first inorganic layer 12. The second inorganic layer 20 comprises orderly-stacked a gate insulating layer 22 and an interlayer insulating layer 22. The gate insulating layer 22 faces the semiconductor layer 50.

The display panel 100 further comprises a first thin film transistor (TFT) T1 and a second TFT T2 positioned in the second inorganic layer 20 and a conductive electrode layer 30 positioned at one side of the first TFT T1 and the second TFT T2 facing away the first transparent substrate 11. The first TFT T1 and the second TFT T2 are positioned in the same layer and the first TFT T1 is close to the function region FA. The conductive electrode layer 30 forms a first pixel electrode 31 in the functional region FA and forms a second pixel electrode 32 in the display region AA. The first pixel electrode 31 is connected to the first TFT T1. The second pixel electrode 32 is connected to the second TFT T2.

Optionally, a bridging layer 40 is positioned between the first TFT T1 and the conductive electrode layer 30. The bridging layer 40 forms a first bridging electrode 41 in the functional region FA and forms a second bridging electrode 42 in the display region AA. Here, the first bridging electrode 41 extends from the functional region FA to the display region AA and is connected to the first TFT T1. The first pixel electrode 31 is connected to the first TFT T1 through the first bridging electrode 41. The second pixel electrode 32 is connected to the second TFT T2 through the second bridging electrode 42.

The display panel 100 further comprises a gate layer 60, a first source/drain layer 70, a second source/drain layer 80 and a plurality of planarization layers. The semiconductor layer 50 is positioned above the first inorganic layer 12. Optionally, a buffer layer 15 could be positioned between the first inorganic layer 12 and the semiconductor layer 50. The semiconductor layer 50 is positioned above the buffer layer 15. The material of the buffer layer 15 could comprise inorganic materials, such as SiOx, SiNx and/or SiON. The buffer layer 15 could prevent some unexpected impurity or pollutant (such as moisture and oxygen) from diffusing from the first transparent substrate 11 to the devices to damage the devices. In addition, the buffer layer 15 could provide a planar top surface.

The semiconductor layer 50 forms the channel regions and the source region 52 and drain regions 53 located at both sides of the channel regions of the first TFT T1 and the second TFT in the display region AA. The gate insulating layer 22 covers the semiconductor layer 50 and the first inorganic layer 12. In addition, if the display panel 100 further comprises a buffer layer 15, the gate insulating layer 22 covers the semiconductor 50 and the buffer layer 15.

The gate insulating layer 60 is positioned above the gate insulating layer 22. The gate layer 60 forms the gates 61 of the first TFT T1 and the second TFT T2 in the display region AA. The gate 61 is positioned correspondingly to the channel region 51. In addition, the gate layer 60 could form signal lines, such as a gate scan line 63, in the display region AA. The gate layer 60 forms a signal transmission line 62 in the bending region PA. The first signal transmission 62 is connected to the gate scan line 63 for providing a scan signal to the gate 61 to turn on/off the first TFT T1 and the second TFT T2.

The interlayer insulating layer 23 covers the gate layer 60 and the gate insulating layer 22. The interlayer insulating layer 23 has the first via 21 in the bending region PA and has a third via 231 in the display region AA.

The first via 21 comprises a first sub-via 211 and a second sub-via 212. The opening of the first sub-via 211 is larger than the opening of the second sub-via 212. The first sub-via 211 and the third vias 231 are formed in the same manufacturing step. The first sub-via 211 and the third vias 231 all pass through the interlayer insulating layer 23 and a part of the gate insulating layer 22. The third vias 231 respectively exposes the source regions 52 and the drain regions 53. As shown in FIG. 4, when the first sub-via 211 and the third vias 231 are being formed, the fourth via 232 is formed in the bending region PA. The fourth via 232 also passes through the interlayer insulating layer 23 and a part of the gate insulating layer 22 to expose the first signal transmission line 62.

After the first sub-via 211 is formed, a dry etching process is performed to etch the film layers at the bottom of the first sub-via to form the second sub-via 212 as shown in FIG. 5. The second sub-via 212 passes through the gate insulating layer 22, the buffer layer 15 and a part of the first inorganic layer at the bottom of the first sub-via 211. As The first source/drain layer 70 is positioned above the interlayer insulating layer 23. The first source/drain layer 70 forms a first source 71 and a first drain 72 of the first TFT T1 and the second TFT T2 in the display region AA. The first source 71 and the first drain 72 are respectively connected to the corresponding source region 52 and the drain region 52 through different third vias 231. In addition, the first source/drain layer 70 further forms a data line 74 in the display region.

The first source/drain layer 70 forms a second signal transmission line 73 in the bending region PA. A part of the second signal transmission line 73 is connected to the corresponding data line 74 for providing a data signal to the corresponding first TFT T1 and the second TFT T2. Another part of the second signal transmission line 73 is connected to the first signal transmission line 62 through the fourth via 232.

The first planarization layer 91 covers the first source/drain layer 70 and the interlayer insulating layer 23 and fills up in the first via 21. The first planarization layer 91 is manufactured with an organic material and is filled up in the first via 21 to raise the bending performance of the bending region PA. This could also simplify the manufacturing process for filling up another organic material in the first via 21.

When the first planarization layer 91 is formed by coating, inkjet printing or another process to form the organic material solvent on another film layer and then curing the solvent. The first block part 10-1 could corresponding to the bottom of the first via 21 could efficiently block the organic material solvent from entering the first transparent substrate 11 to generate free electrons in the first transparent substrate 11. Furthermore, the photolithography process of forming the first via 21 often comprises a dry etching process and a process to remove the photo resistor. The first blocking part 10-1 corresponding to the bottom of the first via 21 could also block the dry etching gas and the liquid for removing the photo resistor from entering the first transparent substrate 11. This further prevents the mura from occurring in the display region AA close to the bending region PA.

The second planarization layer 92 covers the second source/drain layer 80 and the first planarization layer 91. The bridging layer 40 is positioned above the second planarization layer 92. The bridging layer 40 is a transparent conductive electrode layer to raise the transparency of the functional region FA. The material for the bridging layer comprises ITO, IZO, ZnO, $In_2O_3$ or another transparent conductive oxide (TCO) material. The first bridging electrode 41 and the second bridging electrode 42 of the bridging layer 40 are respectively connected to the corresponding second sources 81 through different vias in the second planarization layer 92.

The third planarization layer 93 covers the bridging layer 40 and the second planarization layer 92. The conductive electrode layer 30 is positioned above the third planarization layer 93. The first pixel electrode 31 and the second pixel electrode 32 formed by the conductive electrode layer 30 are respectively connected to the first bridging electrode 41 and the second bridging electrode 42 through different vias in the third planarization layer 93. Through setting the first TFT T1 in the display region AA close to the functional region FA and connecting the first bridging electrode 41 to the first pixel electrode 31, the functional region FA could have a better transparency without sacrificing the display function of the functional region FA. Optionally, the material of the conductive electrode layer 30 could be the same as the material of the bridging layer 40. Or, the material of the conductive electrode layer 30 could be selected from electrode materials, such as Ag, Mg, Al, Pt, Pd, Au, Nd, Ir, Cr and/or other materials.

The display panel 100 further comprise a pixel definition layer 94 positioned above the conductive electrode layer 30 and the third planarization layer 93. The pixel definition layer 94 has pixel openings 941 corresponding to the first pixel electrode 31 and the second pixel electrode 32 to expose the first pixel electrode 31 and the second pixel electrode 32.

Figure 6:
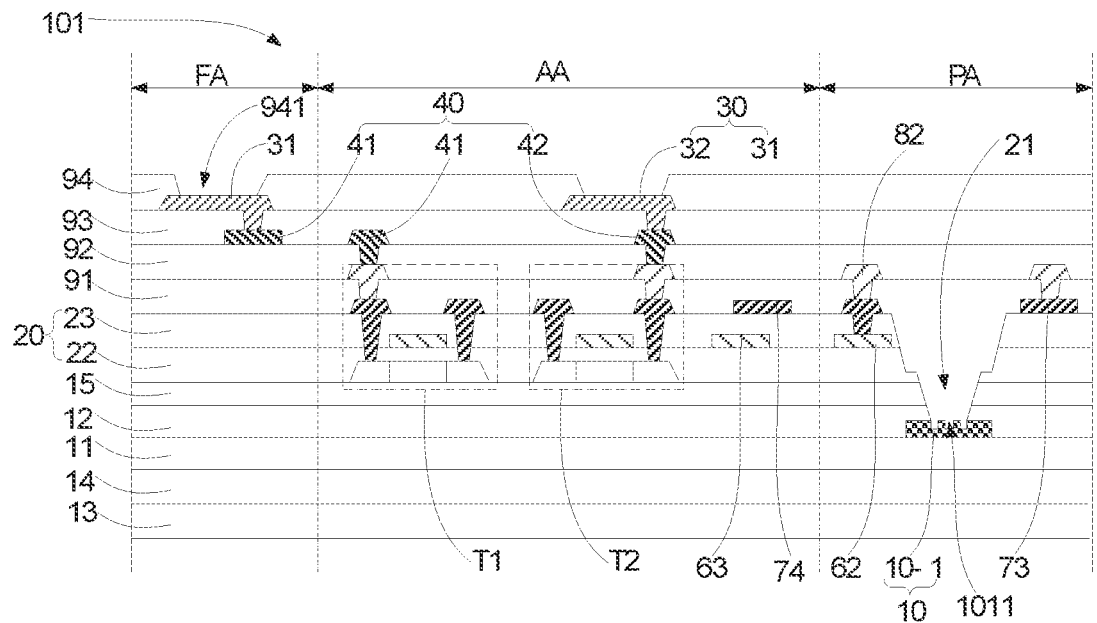
FIG. 6 is a diagram of a cross section of a display panel according to a second embodiment of the present disclosure.

Please refer to FIG. 6. FIG. 6 is a diagram of a cross section of a display panel according to a second embodiment of the present disclosure. The difference between this embodiment and the above embodiment is: in the display panel 101 of this embodiment, a second groove 1011 is positioned at one side of the first blocking part facing away the first transparent substrate 11. The second groove 1011 could extend the expansion/penetration paths of the moisture and reduce the stress expansion introduced by the thermal stress of the first transparent substrate 11 within the area of the first via 21. In this way, the moisture and the stress could be released to alleviate the mura occurred in the display region AA close to the bending region PA. In addition, the second groove 1101 could reduce the bending stress in the bending region PA to raise the reliability when the bending region PA of the display panel 100 is bended. Optionally, the cross section of the second groove 1011 could be in a shape of rectangular, trapezoid, or a triangle.

Figure 7:
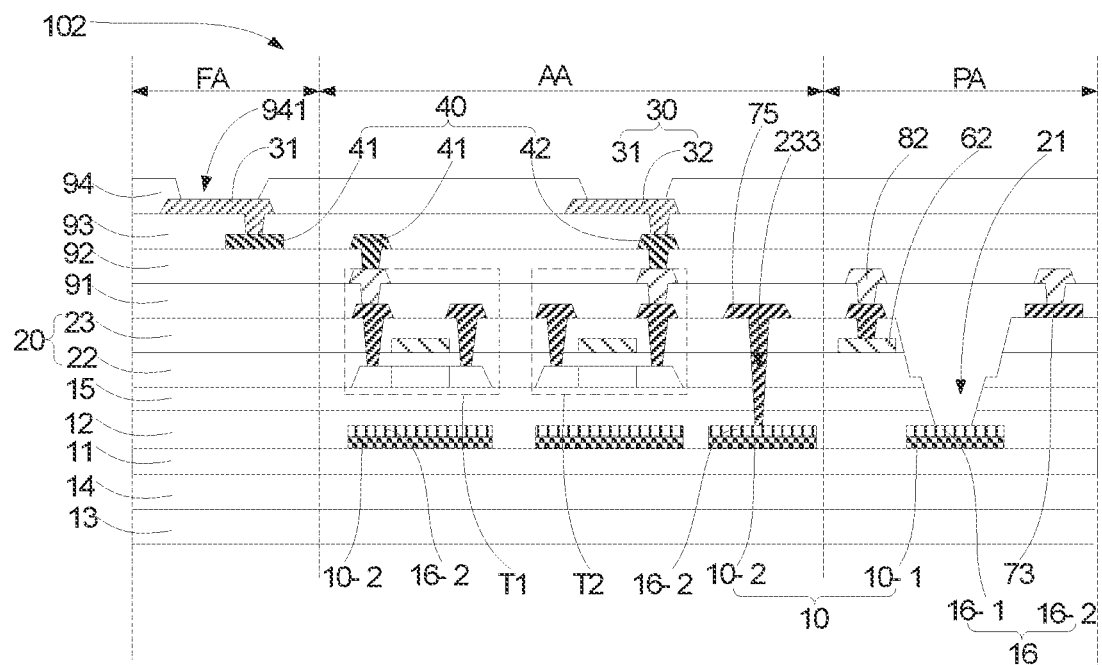
FIG. 7 is a diagram of a cross section of a display panel according to a third embodiment of the present disclosure.

Please refer to FIG. 7. FIG. 7 is a diagram of a cross section of a display panel according to a third embodiment of the present disclosure. The difference between this embodiment and the above embodiments is: in the display panel 102 of this embodiment, the display panel 102 further comprises a shielding layer 16 between the blocking layer and the first inorganic layer 12. The blocking layer 10 further comprises second blocking parts 10-2 periodically positioned in the display region AA. The shielding part 16 comprises a first shielding part 16-1 corresponding to the first blocking part 10-1 and a second shielding part 16-2 corresponding to the second blocking part 10-2.

Specifically, the second blocking part 10-2 and the first blocking part 10-1 belong to the same layer and are positioned with an interval. A part of the second blocking part 10-2 is corresponding to the semiconductor layer 50 such that the second blocking part 10-2 at least partially overlaps with the semiconductor layer 50. That is, the first TFT T1 and the second TFT T2 both correspond to the second blocking part 10-2.

The shielding layer 16 is positioned at one side of the blocking layer 10 facing away the first transparent substrate 11. Here, the first shielding part 16-1 is positioned correspondingly to the first blocking part 10-1 such that the bottom surface of the first via 21 extends to the shielding layer 16 and exposes the first shielding part 16-1. The second shielding part 16-2 is positioned correspondingly to the second blocking part 10-2 such that the second shielding part 16-2 at least partially overlaps with the semiconductor layer 50.

Furthermore, the first shielding part 16-1 is positioned in overlap with the first blocking part 10-1. The second shielding part 16-2 is positioned in overlap with the second blocking part 10-2. In this way, the shielding layer 16 and the blocking layer 10 could be formed by the same mask. Specifically, after an inorganic film or an organic film is formed on the first transparent substrate 11, a metal film is then formed on the inorganic film or the organic film. The metal film could be a molybdenum or an aluminum film. Then, a single mask is used to perform the exposure, lithography and etching processes on the metal film and the inorganic/organic film to form patterned the first shielding part 16-1, the second shielding part 16-2, the first blocking part 10-1 and the second blocking part 10-2. In this embodiment, the thickness of the shielding layer 16 is smaller than the thickness of the blocking layer 10. The thickness of the shielding layer 16 is 50-500 A.

In this way, the shielding layer 16 and the blocking layer 10 are simultaneously formed without using an additional mask. This reduces the cost. The shielding layer 16 could shield the charges in the first transparent substrate 11 and the second transparent substrate 13 to prevent the charges from affecting the characteristics of the transistors in the display region AA. The charges in the first transparent substrate 11 and the second transparent substrate will be polarized under the effect of electric fields. Thus, the polarized charges will act as a fake gate on the back of the channel in the semiconductor layer 50. This is similar to a back channel effect and results in a threshold voltage shift of the transistor and image sticking (IS) in the entire display region AA of the display panel 102. Here, the charges in the first transparent substrate 11 and the second transparent substrate 13 mainly come from the electrons transportation of a diamine and a dianhydride and the charges of the transparent substrate interface.

Furthermore, in order to allow the shielding layer 16 to have a better effect of shielding charges, a constant voltage signal is applied to the shielding layer 16. Specifically, when the interlayer insulating layer 23 is being patterned to form the first via 21, the second via 233 is also formed in the display region AA. The second via 233 exposes a part of the second shielding part 16-2. The first source/drain layer 70 further forms a power line (VDD) 75 in the display region AA. The power line 75 and the first source 71 belong to the same layer. The power line 75 is connected to the second shielding part 16-2 through the second via 233. The power line 75 carries a constant DC voltage and thus the second shield part 16-2 connected to the power line 75 also carries the same constant DC power. Please note, this is not a limitation of the present disclosure. The second shielding 16-2 is not necessary to be connected to the power line 75. In another embodiment, the shielding layer 16 could be positioned at a side of the shielding layer 10 facing the first transparent substrate 11 without being connected to the power line 75.

Figure 8:
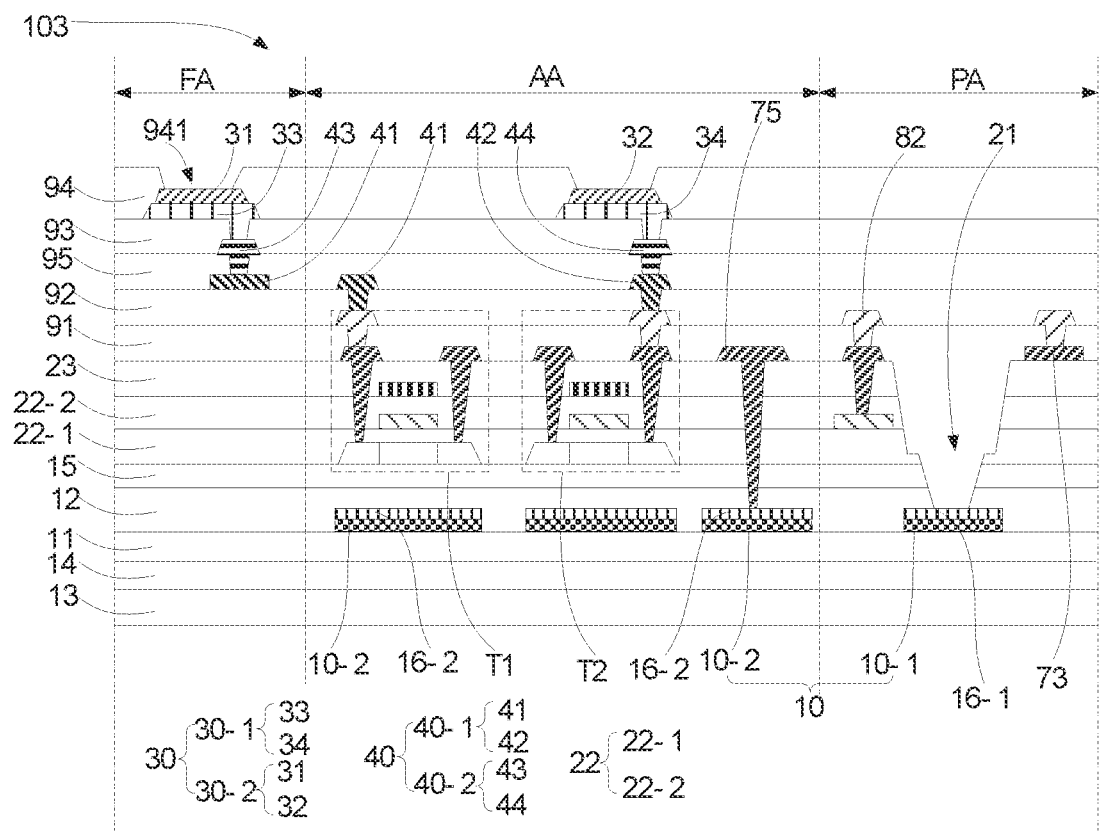
FIG. 8 is a diagram of a cross section of a display panel according to a fourth embodiment of the present disclosure.
Figure 9:
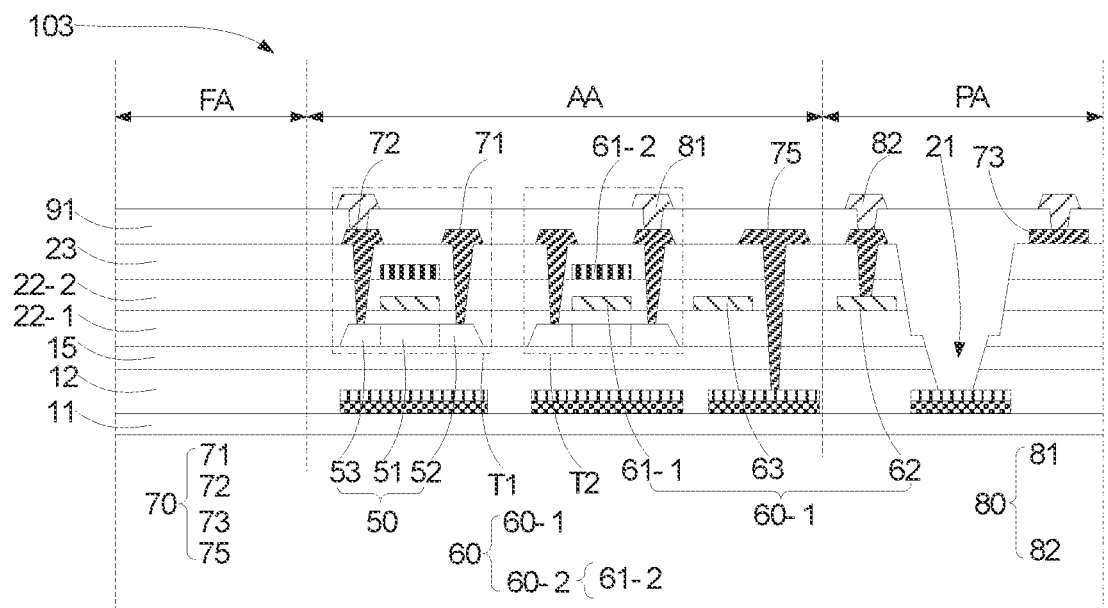
FIG. 9 is a diagram of a partial cross section of the display panel shown in FIG. 8.

Please refer to FIG. 8 and FIG. 9. FIG. 8 is a diagram of a cross section of a display panel according to a fourth embodiment of the present disclosure. FIG. 9 is a diagram of a partial cross section of the display panel shown in FIG. 8. The difference between this embodiment and the above embodiments is: in the display panel 102 of this embodiment, the display panel 102 uses a double gate structure, the bridging layer adopts a multi-layer bridging structure, and the conductive electrode layer 30 adopts a stacked structure.

The gate layer 60 comprises a gate layer 60-1 and a second gate layer 60-2. Correspondingly, the gate insulating layer 22 comprise a first gate insulating layer 22-1 and a second gate insulating layer 22-2. The first gate insulating layer 22-1 is positioned between the semiconductor layer 50 and the first gate insulating layer 60-1. The second gate insulating layer 22-2 is positioned between the first gate layer 60-1 and the second gate layer 60-2. The first gate layer 60-1 forms the first gate 61-1 of the first TFT T1 and the second TFT T2 and also forms the corresponding gate scan line 63. The first gate layer 60-1 forms the first signal transmission line 62 in the bending region PA. The second gate layer 60-2 forms the second gate 61-2 of the first TFT T1 and the second TFT T2 in the display region AA. Please note, the second gate layer 60-2 could form other signal lines in the display region AA and other corresponding signal transmission lines in the bending region PA.

Furthermore, in this embodiment, the bridging layer 40 is a multi-layer structure, which could better adjust the stress center layer of the bending region PA. The bridging layer 40 comprises a first bridging layer 40-1 and the second bridging layer 40-2. The first bridging layer 40-1 is positioned above the second planarization layer 92. Correspondingly, a fourth planarization layer 95 is required. The fourth planarization layer 95 covers the first bridging layer 40-1 and the second planarization layer 92. The second bridging layer 40-2 is positioned above the fourth planarization layer 95. The third planarization 93 covers the second bridging layer 40-2 and the fourth planarization layer 95. The first bridging layer 40-1 forms a first bridging electrode 41 in the functional layer FA and forms a second bridging layer 42 in the display region AA. The second bridging layer 40-2 forms a third bridging electrode 43 in the functional region FA and forms a fourth bridging electrode 44 in the display region AA. Here, the first bridging electrode 41 extends from the functional region FA to the display region AA and is connected to the second source 81 of the first TFT T1. The third bridging electrode 43 is connected to the first bridging electrode 41. The second bridging electrode 42 is connected to the second source 81 of the second TFT T2. The fourth bridging electrode 44 is connected to the second bridging electrode 42.

The conductive electrode layer 30 is positioned above the third planarization layer 93. The conductive electrode layer 30 comprises stacked a first conductive electrode layer 30-1 and a second conductive electrode layer 30-2. The first conductive electrode layer 30-1 forms a first auxiliary electrode 33 in the functional region FA and forms a second auxiliary electrode 34 in the display region AA. The first auxiliary electrode 33 is connected to the third bridging electrode 43. The second auxiliary electrode 34 is connected to the fourth bridging electrode 44. The second conductive electrode layer 30-2 forms a first pixel electrode 31 in the functional region FA and forms a second pixel electrode 32 in the display region AA. The first pixel electrode 31 is connected to the first auxiliary electrode 33. The second pixel electrode 32 is connected to the second auxiliary electrode 34.

Figure 10:
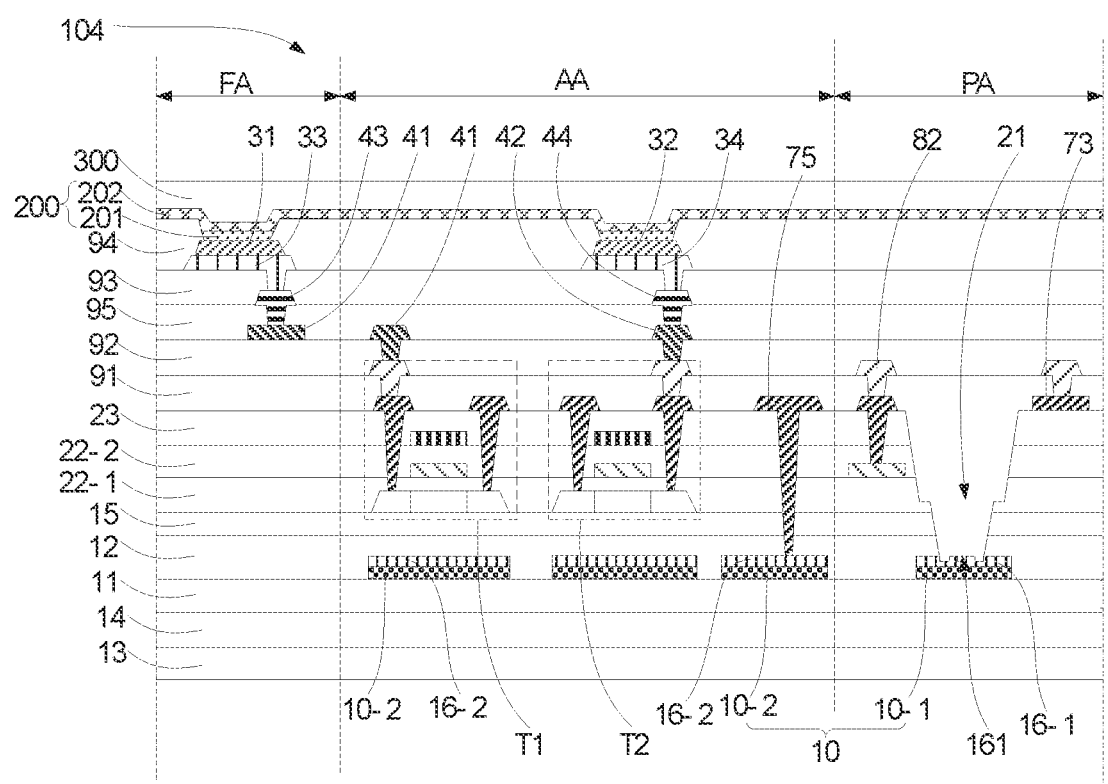
FIG. 10 is a diagram of a cross section of a display panel according to a fifth embodiment of the present disclosure.

Please refer to FIG. 10. FIG. 10 is a diagram of a cross section of a display panel according to a fifth embodiment of the present disclosure. The difference between this embodiment and the above embodiments is: in the display panel 104 of this embodiment, a first groove 161 is positioned at one side of the first shielding part 16-1 facing away the first blocking part 10-1. Through the first groove 161, the bending stress in the bending region PA could be reduced and the reliability of the bending region of the display panel could be raised. The cross section of the first groove 161 could be in a shape of rectangular, a square, a trapezoid or a triangle.

The display panel 104 further comprises a light emitting functional layer 200 above the pixel definition layer 94. In order to protect the light emitting functional layer 200, the display panel 104 further comprises a packaging layer 300 positioned above the light emitting functional layer 200.

Specifically, the light emitting functional layer 200 comprises a light emitting unit 201 and a cathode 202. The light emitting unit 201 is formed by a light emitting material inkjet printed in the pixel opening of the pixel definition layer 94. The light emitting materials of different colors form light emitting units of different colors such that a color image could be displayed. For example, the light emitting unit 201 could comprise a red light emitting unit formed by a red light emitting material, a blue light emitting unit formed by a blue light emitting material, and a green light emitting unit formed by a green light emitting material.

The anode 202 covers the light emitting unit 201 and the pixel definition layer 94. The light emitting unit 201 generates light under the effect of the anode 202 and the corresponding pixel electrode (such as the first pixel electrode 31 or the second pixel electrode 32).

The light emitting functional layer 200 could comprise a hole-injecting layer (HIL) and a hole-transporting layer (HTL) positioned between the light emitting unit 201 and the pixel electrode, and an electron-injecting layer (EIL) and an electron-transporting layer (ETL) positioned between the light emitting unit 201 and the anode 202. The HIL receives the holes transmitted from the pixel electrode. The holes are transported to the light emitting unit 201 through the HTL. The EIL receives the electrons transmitted from the anode 202. The electrons are transmitted to the light emitting unit 201 through the ETL. The holes and the electrons are combined in the position of the light emitting unit 201 to form excitons, which generate light because the excitons migrate from an excited state to the ground state.

The packaging layer 300 covers the light emitting functional layer 200 for protecting the light emitting unit 201 of the light emitting functional layer 200 to prevent the moisture from entering the light emitting unit 201 to make the light emitting unit 201 ineffective. Optionally, the packaging layer 300 could use a thin film packaging. For example, the packaging layer 300 could be a stacked structure formed by three layers, including a first inorganic packaging layer, an organic packaging layer, and a second inorganic packaging layer orderly stacked together or more layers.

The display panel 104 could further comprise a touch electrode, a polarizer, and a cover plate positioned at one side of the packaging layer 300 facing away the light emitting functional layer 200. Other illustrations could be referred to the above embodiments and are omitted here.

According to an embodiment, an electronic device is provided. The electronic device comprises a functional component and a display panel of any one of the above embodiments. The functional component comprises a camera, a fingerprint sensor, or etc. The electronic device comprises a cell phone, a tablet, and/or a wearable electronic equipment.

According to an embodiment of the present disclosure, a display panel and an electronic device are provided. The display panel comprises a display region and a bending region positioned at one side of the display region. The display panel further comprises a first transparent substrate, a first inorganic layer at one side of the transparent substrate, and a second inorganic layer at one side of the inorganic layer facing away the first transparent substrate. The second inorganic layer has a first via in the bending region of the display panel. The first via passes through a part of the first inorganic layer and the second inorganic layer such that the first inorganic layer has a whole film layer of a certain thickness in a region corresponding to the first via to protect the first transparent substrate from the moisture or the etchant for etching the first via. This alleviates the mura near the bending region due to the exposure of the first transparent substrate and thus alleviates the mura issue occurred on the conventional display panel close to the bending region.

Above are embodiments of the present disclosure, which does not limit the scope of the present disclosure. Any modifications, equivalent replacements or improvements within the spirit and principles of the embodiment described above should be covered by the protected scope of the disclosure.

What is claimed is:

1. A display panel, having a display region and a bending region positioned at one side of the display region, the display panel comprising:
    a first transparent substrate;
    a blocking layer, positioned at one side of the first transparent substrate, the blocking layer comprising:
    a first blocking part, located in the bending region;
    a first inorganic layer, covering the first transparent substrate and the blocking layer;
    a semiconductor layer, positioned at one side of the first inorganic layer facing away the first transparent substrate;
    a second inorganic layer, covering the semiconductor layer and the first inorganic layer;
    wherein the second inorganic layer has a first via in the bending region, the first via passes through the second inorganic layer and the first inorganic layer, and an orthographic projection of a bottom of the first via on the first transparent substrate falls within an orthographic projection of the first blocking part on the first transparent substrate; the blocking layer further comprises a plurality of second blocking parts periodically positioned in the display region, and the second blocking parts at least partially overlap with the semiconductor layer.

2. The display panel of claim 1, further comprising:
    a shielding layer, positioned between the blocking layer and the first inorganic layer, the shielding layer comprising:
    a first shielding part, positioned correspondingly to the first blocking part; and
    a second shielding part, positioned correspondingly to the second blocking part.

3. The display panel of claim 2, wherein a bottom surface of the first via extends to the shielding layer and exposes the first shielding part.

4. The display panel of claim 2, wherein the second shielding part at least partially overlaps with the semiconductor layer.

5. The display panel of claim 2, wherein the first shielding part overlaps with the first blocking part and the second shielding part overlaps with the second blocking part.

6. The display panel of claim 2, wherein a first groove is positioned at one side of the first shielding part facing away the first blocking part.

7. The display panel of claim 2, wherein the second inorganic layer comprises orderly stacked a gate insulating layer and an inter-layer insulating layer; the gate insulating layer covers the semiconductor layer and the first inorganic layer; and the display panel further comprises:
    a gate layer, positioned above the gate insulating layer, wherein the inter-layer insulating layer covers the gate layer and the gate insulating layer and is patterned to form the first via and to form a second via in the display region, and the second via exposes a part of the second shielding part; and
    a first source/drain layer, positioned above the inter-layer insulating layer, configured to form a power line in the display region, wherein the power line is connected to the second shielding part through the second via.

8. The display panel of claim 7, further comprising a functional region close to the display region and a first thin film transistor (TFT) and a second TFT positioned in the display region, the first TFT is close to the functional region, and the display panel further comprises:
    a conductive electrode layer, positioned at one side of the first TFT and the second TFT facing away the first transparent substrate, configured to form a first pixel electrode in the functional region and to form a second pixel electrode in the display region, wherein the first pixel electrode is connected to the first TFT and the second pixel electrode is connected to the second TFT;
    wherein the semiconductor layer forms a channel region and a source region and a drain region at two sides of the channel region of the first TFT and the second TFT in the display region; the gate layer forms a gate of the first TFT and the second TFT in the display region and forms a first signal transmission line in the bending region; the gate corresponds to the channel region; the first source/drain layer forms a first source and a first drain of the first TFT and the second TFT in the display region and forms a second signal transmission line in the bending region; the first source is connected to the source region; the first drain is connected to the drain region; and the first signal transmission line is connected to the second transmission line.

9. The display panel of claim 8, further comprising:
    a bridging layer, positioned between the first TFT and the conductive electrode layer, configured to form a first bridging electrode in the functional region and to form a second bridging electrode in the display region;
    wherein the first pixel electrode is connected to the first TFT through the first bridging electrode and the second pixel electrode is connected to the second TFT through the second bridging electrode.

10. The display panel of claim 9, further comprising:
    a first planarization layer, covering the first source/drain layer and the inter-layer insulating layer and filled up in the first via;

a second source/drain layer, positioned above the first planarization layer, configured to form a second source of the first TFT and the second TFT in the display region and to form a plurality of bonding wires in the bending region;

a second planarization layer, covering the second source/drain layer and the first planarization layer, wherein the bridging layer is positioned above the second planarization layer; and a third planarization layer, covering the bridging layer and the second planarization layer, wherein the conductive electrode layer is positioned above the third planarization layer;

wherein the first bridging electrode and the second bridging electrode are respectively connected to the corresponding second source; and the bonding wires are connected to the second signal transmission line.

11. The display panel of claim 1, wherein a second groove is positioned at one side of the first blocking part facing away the first transparent substrate.

12. The display panel of claim 1, further comprising:
a third inorganic layer, positioned at one side of the first inorganic layer facing away the first transparent substrate; and
a second transparent substrate, positioned at one side of the third inorganic layer facing away the first transparent substrate.

13. An electronic device, comprising a functional component and a display panel, the display panel having a display region and a bending region positioned at one side of the display region, the display panel comprising:
a first transparent substrate;
a blocking layer, positioned at one side of the first transparent substrate, the blocking layer comprising:
a first blocking part, located in the bending region;
a first inorganic layer, covering the first transparent substrate and the blocking layer;
a semiconductor layer, positioned at one side of the first inorganic layer facing away the first transparent substrate;
a second inorganic layer, covering the semiconductor layer and the first inorganic layer;
wherein the second inorganic layer has a first via in the bending region, the first via passes through the second inorganic layer and the first inorganic layer, and an orthographic projection of a bottom of the first via on the first transparent substrate falls within an orthographic projection of the first blocking part on the first transparent substrate; the blocking layer further comprises a plurality of second blocking parts periodically positioned in the display region, and the second blocking parts at least partially overlap with the semiconductor layer.

14. The electronic device of claim 13, wherein the display panel further comprises:
a shielding layer, positioned between the blocking layer and the first inorganic layer, the shielding layer comprising:
a first shielding part, positioned correspondingly to the first blocking part; and
a second shielding part, positioned correspondingly to the second blocking part.

15. The electronic device of claim 14, wherein a bottom surface of the first via extends to the shielding layer and exposes the first shielding part.

16. The electronic device of claim 14, wherein the second shielding part at least partially overlaps with the semiconductor layer.

17. The electronic device of claim 14, wherein the first shielding part overlaps with the first blocking part and the second shielding part overlaps with the second blocking part.

18. The electronic device of claim 14, wherein a first groove is positioned at one side of the first shielding part facing away the first blocking part.

19. The electronic device of claim 14, wherein the second inorganic layer comprises orderly stacked a gate insulating layer and an inter-layer insulating layer; the gate insulating layer covers the semiconductor layer and the first inorganic layer; and the display panel further comprises:
a gate layer, positioned above the gate insulating layer, wherein the inter-layer insulating layer covers the gate layer and the gate insulating layer and is patterned to form the first via and to form a second via in the display region, and the second via exposes a part of the second shielding part; and
a first source/drain layer, positioned above the inter-layer insulating layer, configured to form a power line in the display region, wherein the power line is connected to the second shielding part through the second via.

20. The electronic device of claim 13, the display panel further comprising:
a third inorganic layer, positioned at one side of the first inorganic layer facing away the first transparent substrate; and
a second transparent substrate, positioned at one side of the third inorganic layer facing away the first transparent substrate.

* * * * *